United States Patent [19]

Fazlin et al.

[11] Patent Number: 4,806,225
[45] Date of Patent: Feb. 21, 1989

[54] DESMEARING AND PLATED-THROUGH-HOLE APPARATUS

[75] Inventors: Fazal A. Fazlin, St. Petersburg; Rex A. Lee, Tampa, both of Fla.

[73] Assignee: Advanced Plasma Systems, Inc., St. Petersburg, Fla.

[21] Appl. No.: 832,862

[22] Filed: Feb. 24, 1986

Related U.S. Application Data

[63] Continuation-in-part of Ser. No. 804,227, Dec. 2, 1985, abandoned, which is a continuation of Ser. No. 483,168, Apr. 8, 1983, abandoned, which is a continuation-in-part of Ser. No. 383,311, May 28, 1982, Pat. No. 4,474,659.

[30] Foreign Application Priority Data

Feb. 27, 1985 [JP] Japan .................. 60-26326[U]

[51] Int. Cl.⁴ ............ C23C 14/04; C23C 14/02; C23C 14/34; C23C 14/56
[52] U.S. Cl. .................... 204/298; 118/503; 118/719; 118/729; 156/345
[58] Field of Search ............. 204/298; 118/719, 729, 118/503, 723; 271/205, 206; 156/345; 198/470.1, 803.7

[56] References Cited

U.S. PATENT DOCUMENTS

| | | | |
|---|---|---|---|
| 3,100,637 | 8/1963 | Brown | 271/205 |
| 4,012,307 | 3/1977 | Phillips | 204/164 X |
| 4,172,021 | 10/1979 | Gladish | 118/726 X |
| 4,351,697 | 9/1982 | Shanefield et al. | 427/97 |
| 4,425,210 | 1/1984 | Fazlin | 204/298 X |
| 4,587,002 | 5/1986 | Bok | 204/298 |

FOREIGN PATENT DOCUMENTS

| | | | |
|---|---|---|---|
| 0136562 | 4/1985 | European Pat. Off. | 204/298 |
| 2522352 | 12/1976 | Fed. Rep. of Germany | 204/298 |

OTHER PUBLICATIONS

Cairns, M., *Sputtering: A Surface Treatment for Economy and Fine Finish*, Design Engineering, Nov. 1970, pp. 83–85.

Barber, G. F., *Two-Chamber Air-to-Vacuum Lock System*, IBM Technical Disclosure Bulletin, vol. 11, No. 7, Dec. 1968, pp. 757–758.

Catalog & "Torus ®" Sputtering Sources, Published by Enerjet, a division at Kurt J. Lesker Co., undated, pp. 1–14.

*Primary Examiner*—Evan K. Lawrence
*Attorney, Agent, or Firm*—Dominik, Stein, Saccoci, Reese, Colitz & Van Der Wall

[57] ABSTRACT

An integrated plasma desmearing and plated-through-hole apparatus for first plasma desmearing a printed circuit board and then plating through the holes of the plated circuit board by sputtering. The apparatus comprises a plurality of vacuum chambers serially interconnected together. Preferably, five vacuum chambers are provided including a loading chamber, a desmearing chamber, a plating preparation chamber, a plating chamber and an unloading chamber. Airtight isolation doors isolate each chamber from the others. A transport system is provided for serially transporting the printed circuit boards through the chambers.

6 Claims, 9 Drawing Sheets

DESMEARING AND PLATED-THROUGH-HOLE APPARATUS

CROSS-REFERENCE TO RELATED APPLICATIONS

This is a continuation-in-part of the application entitled 37 Plated-Through-Hole Apparatus and Method", Ser. No. 804,227, filed Dec. 2, 1985, abandoned, which is a continuation of Ser. No. 483,168, filed Apr. 8, 1983, abandoned, which is a continuation-in-part of Ser. No. 383,311, filed May 28, 1982, now U.S. Pat. No. 4,474,659, the disclosures of which are hereby incorporated by reference herein.

BACKGROUND OF THE INVENTION

1. Field of the Invention

This invention relates to a desmear and plated-through-hole apparatus and method. More particularly, this invention relates to an apparatus and method for desmearing and then depositing a thin layer of metal onto the entire inside surface of a hole in an object, such as a printed circuit board.

2. Description of the Background Art

Presently, there exist many techniques used in the manufacture of a printed circuit board. Basically, the four different types of printed circuit boards are single sided boards, double sided boards, multi-layered boards and flexible boards. Except for single sided boards and single sided flexible boards, it is necessary to provide electrical continuity via the holes in the boards, between the conductive pattern on each side of the board. This is accomplished by first removing epoxy smear caused by the dilling operation and then plating a layer of conductive material onto the inside surface of the hole in the board, typically referred to as the desmearing and plated-through-hole operations, respectively, of the manufacturing process.

Drill smear can be removed from within the holes by utilizing an etchback process, or by utilizing the novel plasma desmearing apparatus and method which is disclosed in U.S. Pat. Nos. 4,425,210 and 4,328,081 the disclosures of which are hereby incorporated by reference herein.

The presently available plated-through-hole methods consist of electrolytic plating, electroless plating and immersion plating. Each of these methods have its own particular advantages and disadvantages which largely depend on the type of printed circuit board being treated. By way of example, electroless plating, which is probably the most widely used commercial method, basically comprises subjecting the boards to a cleaning procedure, an activation procedure, and then a copper deposition procedure. More particularly, the cleaning procedure includes cleaning the boards with an alkaline cleaner to remove light oil and grease, fingerprints, etc. The holes in the boards are then "conditioned" to accept activation and subsequent electroless copper deposition. After drill smear is removed from within the holes, the holes are pre-etched by using ammonium persulfate, sodium persulfate, or hydrogen peroxide/sulfuric acid. This removes copper oxide and etches the copper to a uniform matte finish. Next, the boards are dipped into sulfuric acid to remove any persulfate residues which would interfere with adhesion. The boards are then thoroughly rinsed in water to remove any sulfuric acid residues. This completes the cleaning procedure of the plated-through-hole operation.

The activation procedure comprises subjecting the boards to a preactivator (pre-dip) and then an activator (catalyst) which seeds particles of tin/palladium onto the nonconductive holes in order to provide a basis for subsequent electroless copper deposition. After one or more water rinses, the boards are immersed in an accelerator, which dissolves the tin from the tin/palladium complex that was deposited in the holes by the activator. The activation procedure is completed by thoroughly rinsing the boards with tap water or deionized water.

The copper deposition procedure comprises immersing the boards into an electroless copper bath which contains copper sulfate or chloride, sodium hydroxide, a reducing agent such as formaldehyde, and a complexing agent which holds the copper in solution. The boards remain in the copper bath for an appropriate length of time (depending on the desired thickness of the deposited layer of copper), then removed and rinsed in water. After scrubbing and drying the boards, the boards are ready for the image transfer operation.

From the foregoing, it should be appreciated that electroless copper deposition is an extremely lengthy process. Moreover, the multitude of variables involved in the process makes the process more of an art rather than a science, and results in non-uniform deposition of the copper within the holes of the printed circuit boards.

Therefore, it is an object of this invention to provide an apparatus and method which overcomes the aforementioned inadequacies of the prior art devices and provides an improvement which is a significant contribution to the art of desmearing and plating-through-holes of printed circuit boards.

Another object of this invention is to provide an apparatus and method for depositing a material onto an object by using plasma gas techniques.

Another object of this invention is to provide an apparatus and method for depositing a material on the surface of an object in a controlled process with a high level of precise repeatability and at cyclic rates substantially reducing the overall cost of the process.

Another object of this invention is to provide an apparatus and method for depositing the material uniformly on the surface of the object.

Another object of this invention is to provide an apparatus and method for preventing excessive heating of the objects during the deposition of the material thereon.

Another object of this invention is to provide an intergrated apparatus and method for first plasma desmearing plated holes of an object, such as a multi-layer printed circuit board, and then plating through such holes to deposit a material, such as metal, onto the inside surfaces thereof to electrically interconnect the metal interlayers of the board.

Another object of this invention is to provide a plasma desmearing and plated-through-hole apparatus and method for multi-layer printed circuit boards and the like which utilizes conventional cathode sputtering techniques for sputtering atoms of the metal cathode into the holes of the printed circuit board.

Another object of this invention is to provide a desmearing and plated-through-hole apparatus and method which uses a series of interconnected vacuum chambers to first desmear the printed circuit board in a vacuum chamber and then transport the desmeared printed circuit board to other serially connected vacuum chambers to maintain the printed circuit board in an air-free environment free of contaminants.

The foregoing has outlined some of the more pertinent objects of the invention. These objects should be construed to be merely illustrative of some of the more prominent features and applications of the intended invention. Many other beneficial results can be attained by applying the disclosed invention in a different manner by modifying the invention within the scope of the disclosure. Accordingly, other objects and a fuller understanding of the invention may be had by referring to the summary of the invention and the detailed description of the preferred embodiment in addition to the scope of the invention defined by the claims taken in conjunction with the accompanying drawings.

SUMMARY OF THE INVENTION

The invention comprises a plasma plated-through-hole apparatus and method which deposits a thin layer of material, such as metal, within the hole of an object, such as a printed circuit board. The invention also comprises an intergrated plasma desmearing and plated-through-hole appartus and method the appended claims being limited to the last-mentioned apparatus.

Plasma Plated-Through-Hole Apparatus and Method

The apparatus of the invention includes a chamber having a gas diffusion chamber connected to each end thereof. Means are provided for introducing a mixture of gases into one or both of the gas diffusion chambers for evacuating the chamber and for producing the desired flow of the gas in one direction and then in the other direction within the chamber. A plurality of power electrodes with apertures are positioned within the chamber transverse to the direction of the flow of the gases. The objects to be treated, such as the printed circuit boards, are then inserted into the areas between the power electrodes. The output of a generator means is connected to the power electrodes for supplying electrical energy thereto. The outer conductive layers of the printed circuit boards being treated are then connected to the ground of the generator means, or to a negative potential, preferably direct current (d.c.), to complete the path of the electrical energy or are left electrically neutral.

The method of the invention basically comprises introducing the desired gases into one of the diffusion chambers, while creating a reduced pressure in the other gas diffusion chamber such that the gas is drawn through the apertures in the power electrodes and the printed circuit boards. The direction of the flow of the gas is then reversed by introducing the gas into the other gas diffusion chamber and creating a reduced pressure in the opposite gas diffusion chamber. Simultaneously, with the flow of the gas in the chamber, the generator means supplies an amount of electrical energy to the power electrodes. The electrical energy excites the gas to a plasma state as the gas flows through apertures in the power electrodes. As the plasma gas flows through the chamber, a portion of the material constituting the power electrode is sputtered into the holes of the printed circuit boards. The process is continued until the entire inside surface of the holes is uniformly coated with the material constituting the power electrode.

The improved apparatus and method comprises pre-cooling the gas, by means of an external heat exchanger, used during the deposition process. Alternatively, or in combination therewith, the power electrodes of the apparatus may be cooled before and during the deposition process by means of a heat exchanger incorporated into each power electrode. In each instance, the cooling can be accomplished by circulating a coolant fluid, such as nitrogen gas, through the heat exchangers. The pre-cooling of the gas and the cooling of the power electrodes serve to reduce the amount of thermal heat which tends to accumulate in the chamber during the deposition process, thereby eliminating the harmful effects of the heat on the printed circuit boards.

Depending on the thermal characteristics of the plasma gas and on the operating conditions of the process (amount of electrical energy, etc.), it may be necessary to provide additional means to reduce the heat build-up within the chamber. This may be accomplished by injecting a coolant gas, such as nitrogen, into the chamber prior to the deposition process and during "off" periods when the generator means is not supplying electrical energy to the power electrodes.

Plasma Desmearing and Plated-Through-Hole Apparatus and Method

In another embodiment of the invention, the invention comprises an integrated plasma desmearing and plated-through-hole apparatus and method. More specifically, this embodiment comprises a plurality of vacuum chambers serially interconnected with one another by means of isolation doors which, when closed, allow each chamber to be selectively and individually evacuated and injected with desired gases. Opening of the isolation door separating two adjoining vacuum chambers allows the printed circuit board under treatment in the preceding chamber to be transported into the succeeding chamber for further individualized treatment. Finally, the invention also comprises a novel transport system positioned within each chamber to transport the printed circuit boards in the preceeding vacuum chamber into the succeeding vacuum chamber through the doorway of the isolation door. Notably, the transport system of the invention does not interfere with the closing of the isolation doors thereby assuring that each vacuum chamber may be independently controlled, apart from the others.

The method of this embodiment ff the invention comprises first inserting the undesmeared and unplated printed circuit board through the first of the series of vacuum chambers to desmear and, if desired, etch back the board and then passing the desmeared and unplated board through the last of the series of vacuum chambers wherein the holes of the board are plated through using conventional cathode sputtering techniques or the plasma plated-through-hole method described above.

Notably, the above described apparatus and method provides for the complete desmearing and plating of the board in a continuous process, each step of which is individually controlled in the respective vacuum chambers. The desmearing operation tends to clean the board of any organic contaminants prior to plating and thus, unexpected results have been achieved when compared to other plating processors referenced hereinabove. Indeed, experiments have shown that increased plating of the board is achieved because the board is cleaned and then maintained in a evacuated environment free of contaminants until after the board is plated.

The foregoing has outlined rather broadly the more pertinent features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a fuller understanding of the nature and objects of the invention, reference should be had to the following detailed description taken in connection with the accompanying drawings in which.

Similar reference characters refer to similar parts throughout the several views of the drawings.

DETAILED DESCRIPTION OF THE PREFERRED EMBODIMENT

Plasma Plated-Through-Hole

Figure 1:
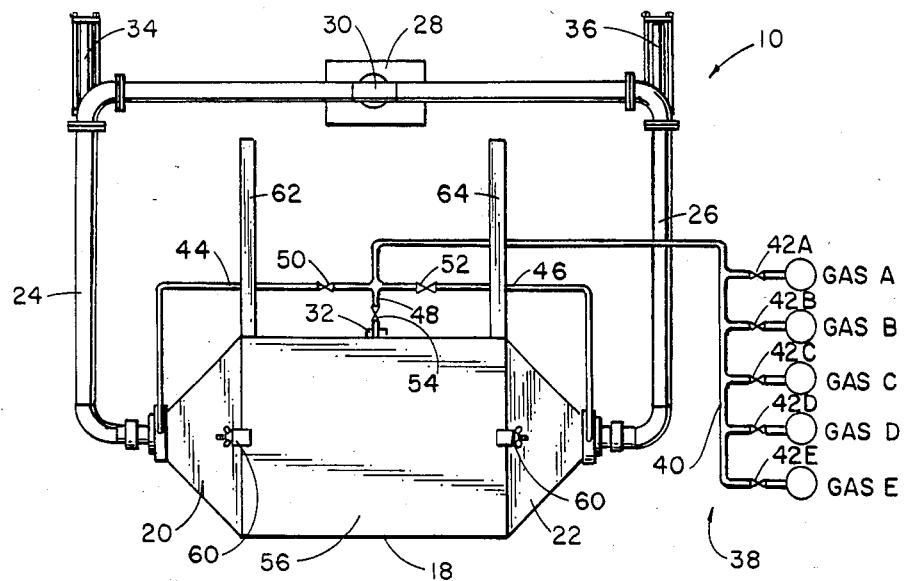
FIG. 1 is a plan view of the plasma plated-through-hole apparatus of the invention showing the chamber thereof and diagrammatically showing the manner in which a plurality of gases are supplied to the chamber.
Figure 2:
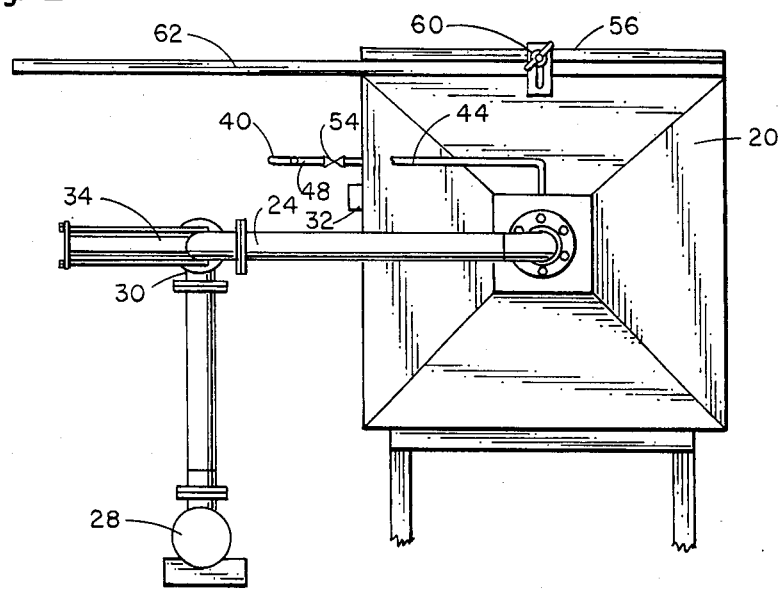
FIG. 2 is a left end view of FIG. 1.

FIG. 1 is a plan view of the plasma plated-through-hole apparatus 10. The invention is designed to deposit a thin layer of material such as a metal 12 (FIG. 5) on the inside surface of a hole 14 in an object such as a double-sided, multi-layered, or flexible printed circuit board 16. More particularly, the apparatus 10 comprises a substantially rectangular chamber 18. A frustopyramidal diffusion chamber 20 is connected to the left side of the chamber 18 (see FIG. 2). Similarly, another frustopyramidal diffusion chamber 22 is connected to the right side of chamber 18. A left and a right exhaust conduit 24 and 26 are respectively connected in fluid communication with the diffusion chambers 20 and 22 and are oriented to extend rearwardly of the chamber 18. The two exhaust conduits 24 and 26 then extend laterally of the chamber 18 and are each connected to a vacuum pump 28 by a tee conduit 30. Preferably, vacuum pump 28 comprises a Stokes Pennwalt vacuum pump, Model 1736, with halocarbon oil for oxygen service which is capable of exhausting the chamber 18 to approximately 11 microns at a rate of 650 cubic feet per minute. A solenoid operated air valve 32 is connected to the rear of the chamber 18 for venting atmospheric air into the chamber 18 to normalize the pressure in the chamber 18. A left and a right exhaust valve 34 and 36 are connected in fluid communication with the left and right exhaust conduits 24 and 26, respectively. Preferably, each of the exhaust valves 34 and 36 comprises a Vacuum Research Corporation exhaust valve, Model 6 AV, which is air activated at 60 p.s.i. and which is solenoid controlled.

The plated-through-hole apparatus 10 of the invention further includes means for supplying a mixture of gases to the chamber 18. More particularly, a plurality of gas bottles 38 are provided for storing a particular gas identified as gases A through E, inclusive. The output of each of the gas bottles 38 is connected to a gas manifold 40. The amount of gas supplied from the bottles 38 to the gas manifold 40 is controlled by means of electrically operated valves 42A-E, or the like. The output of the gas manifold 40 is then connected to a left and a right supply conduit 44 and 46 which are, in turn, connected in fluid communication with the diffusion chambers 20 and 22, respectively. A middle supply conduit 48 similarly extends from the gas manifold 40 to the central area of the chamber 18. Suitable control valves 50, 52 and 54 are connected within the conduits 44, 46 and 48, respectively, to control the flow of gas into the chamber 18.

A lid 56 is secured about the opened end of the chamber 18. The lid 56 comprises a substantially rectangular configuration which is dimensioned to fit over the opened end of the chamber 18. A gasket 58 is positioned about the periphery of the opened end of the chamber 18 enabling the lid 56 to seal about the opened end of the chamber 18 (see FIG. 3). Suitable latches 60 are positioned at opposing ends of the chamber 18 to rigidly secure the lid 56 in the closed position. The lid 56 is operatively connected to a pair of rails 62 and 64 which extend rearwardly of the chamber 18 such that the lid 56 may be slid rearwardly away from the opened end of the chamber 18 to an open position.

Figure 3:
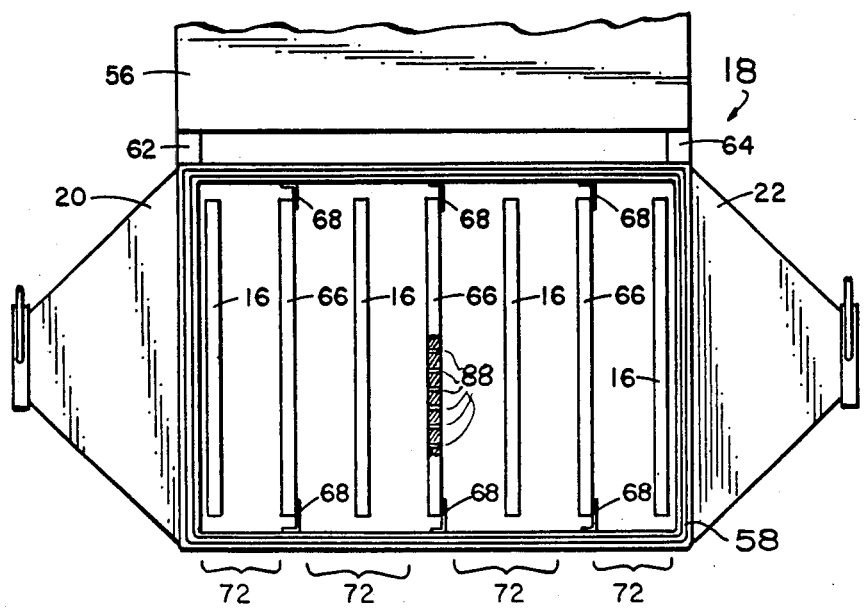
FIG. 3 is a plan view, partially in section, of the chamber with the lid in an open position showing the placement of the power electrodes and the printed circuit boards in the chamber and including a partial cross-sectional view of one of the power electrodes showing the apertures in the power electrode.

FIG. 3 is a plan view, partially in section, of the chamber 18 showing the interior thereof. More particularly, a plurality of power electrodes 66, with apertures 88, are uniformly suspended within the chamber 18 by means of a plurality of electrically insulative standoffs 68 which are rigidly secured to each of the power electrodes 66 about the sides and bottom thereof. The standoffs 68 are then rigidly secured to the inside surface of the chamber 18 such that the power electrodes 66 extend transversely across the longitudinal length of the chamber 18.

Figure 4:
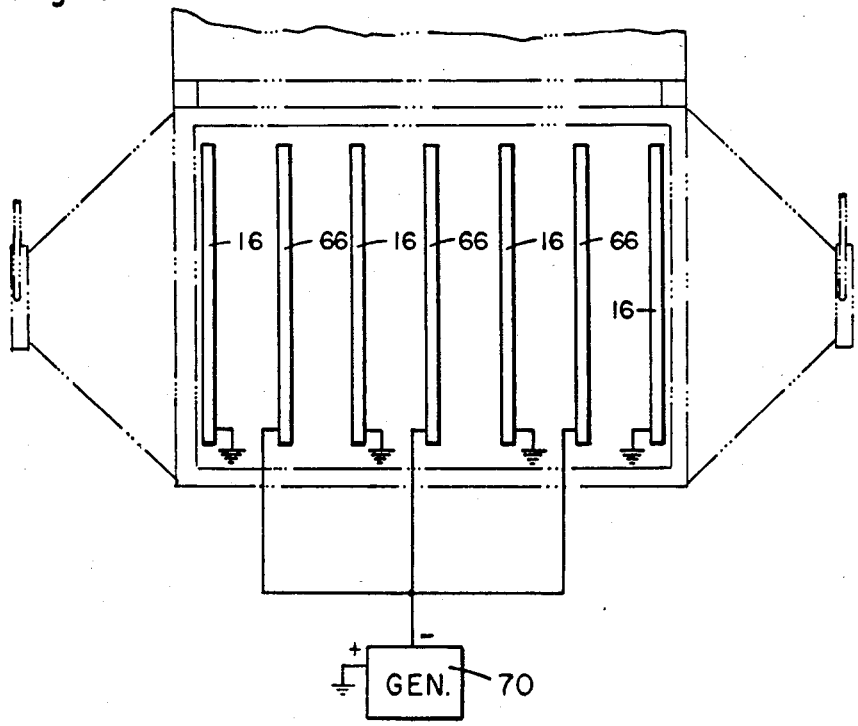
FIG. 4 is a diagrammatical view showing the manner in which the power electrodes and the printed circuit boards are connected to a source of electrical energy.

As shown in FIG. 4, a source of electrical energy, hereinafter referred to as a generator 70, is provided for supplying electrical energy to the power electrodes 66 to create a plasma gas in the chamber 18. Specifically, the output of the generator 70 is connected to the power electrodes 66 by a coaxial cable or the like. The ground of the generator 70 is then connected (not shown) to the chamber 18 and to the printed circuit board 16. The generator 70 may comprise a d.c. generator for supplying electrical energy at a constant rate and power level to the power electrodes 66.

It is noted that the cross-sectional area of the chamber 18 preferably comprises a configuration substantially identical to the configuration of the object 16 to be treated. For example, when treating printed circuit boards 16 which typically include square configurations, it is desirable to configure and dimension the chamber 18 such that the printed circuit boards 16 may be inserted transversely in the chamber 18 without a significant amount of space existing between the peripheral edges of the board 16 and the walls of the chamber 18. Further, it is noted that the power electrodes 66 are preferably uniformly spaced apart from one another and possibly from the sides of the chamber 18 to define receiving areas 72 for receiving one or more printed circuit boards 16.

Referring to FIGS. 1-5, the method of the invention comprising the following steps for depositing a material such as a metal 12 on the inside surface of the holes 14 contained within the printed circuit boards 16. First, the lid 56 is slid rearwardly along the rails 62 and 64 to expose the opened end of the chamber 18. The printed circuit boards 16 are then inserted into the chamber 18 between adjoining power electrodes 66. In the specific embodiment of the chamber 18 which contains four power electrodes 66, shown diagrammatically in FIG. 4, three printed circuit boards are inserted within the chamber 18 such that only one printed circuit board 16 is positioned within each receiving area 72. It should be understood, however, that a plurality of printed circuit boards 16 may be inserted within each receiving area 72 without departing from the spirit and scope of this invention. The next step of the method includes grounding the outermost conduct layers 16A of the printed circuit board 16 (see FIG. 5) to the ground of the generator 70. Next, the lid 56 is slid forwardly along rails 62 and 64 to a closed position over the opened end of the chamber 18. Latches 60 are then tightened to seal and secure the lid 56 in the closed position. The printed circuit boards 16 are now ready to receive the treatment of deposition of the metal 12 in the holes 14 contained in the printed circuit boards 16.

The plated-through-hole portion of the method of the invention comprises first activating the vacuum pump 28 to evacuate the interior of the chamber 18. A desired blend of gases is then selected by controlling valves 42A-E which regulate the selection and the flow rate of the gases contained within the gas bottles 38A-E into the gas manifold 40. The method proceeds by closing the right exhaust valve 36 and opening the right control valve 52 of the right supply conduit 46 while opening the left exhaust valve 34 and closing the left control valve 50 and the middle control valve 54. This causes the selected blend of gases to flow into the right diffusion chamber 22 wherein the gases are uniformly diffused over the cross-sectional area of the chamber 18. The reduced pressure created by the vacuum pump 28, which is supplied to the left exhaust valve 34, draws the gases from the right supply conduit 46 to the left exhaust valve 34 such that the gases flow serially through apertures in the power electrodes 66 and the holes 14 in the printed circuit boards 16 from right to left. After a preselected length of time, the flow of the gases is reversed by closing the right and middle control valves 52 and 54. The vacuum present at the right exhaust valve 36 draws the gases, which are injected into and diffused in the left diffusion chamber 20, serially through the power electrode 66 and the printed circuit boards 16 in the reverse direction.

During the flow of the gases from one end of the chamber 18 to the other, the generator 70 is activated to supply electrical energy to the power electrodes 66. The gases flowing through the apertures 88 in the power electrodes 55 are, therefore, excited to a plasma state. Additionally, with the power electrodes 66 being at least partially composed of the type of material such as the metal 12 to be deposited on the inside of the holes 14 of the printed circuit boards 16, a portion of such metal 12 will be "sputtered" from the power electrodes 66 into the holes 14 (and onto al exposed surfaces) of the printed circuit board 16 adjacent to the power electrode 66. The thickness of the layer of metal 12 deposited in the holes 14 of the printed circuit boards 16 will be progressively increased each time the above procedure is repeated. More uniform plating can be achieved by alternating the direction of the flow of the gas through the power electrodes 66 and the printed circuit boards 16. The plated-through-hole portion of the method of the invention is completed when the desired thickness of the layer of metal in the hole has been achieved. A thickness of 25 to 100 microns is usually adequate.

The next portion of the method of the invention comprises the steps of opening both of the exhaust valves 34 and 36 and injecting nitrogen gas into the chamber 18 via control valves 50, 52 and 54. When all of the unwanted gases have been purged from chamber 18 by the nitrogen gas, air valve 32 is opened to vent atmospheric air into the chamber 18. The lid 56 is then slid rearwardly along rails 62 and 64 to an open position. The treated printed circuit boards 16 are then removed from the chamber 18, thereby completing the method of the invention. The printed circuit boards 16 are now ready for further treatment of the manufacturing process.

Several variations may exist in the plated-through-hole portion of the method of the invention. For example, the control valves 50 and 52 may be controlled to pulsate on and off to create a pulsating flow of gas in one direction through the electrodes 66 and the printed circuit boards 16, and then create another pulsating flow of gas in the other direction through the power electrodes 66 and the printed circuit boards. The method of the invention further contemplates the introduction of gas from the middle supply conduit 48 into the chamber 18 via control valve 54. It is noted, however, that inasmuch as the gas being introduced via control valve 54 will not be subjected to the diffusing characteristics of the diffusion chambers 20 and 22, the use of the middle control valve 54 should be limited to introducing a small among of gas into the chamber 18 to compensate for any depletion of the plasma gas therein.

Figure 5:
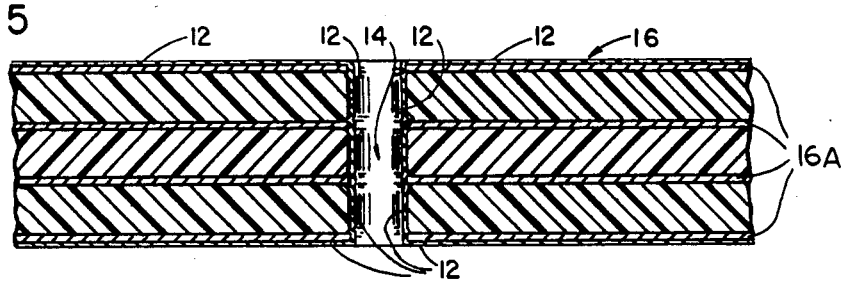
FIG. 5 is a cross-sectional view of a multi-layered printed circuit board which has been treated by the plated-through-hole method of the invention.

From the above description of the invention, it should be appreciated that a novel concept has been disclosed for depositing a material within the inside of a hole in an object. In the specific illustration shown in the drawings, the method has been discussed in relation to depositing a layer of metal 12 within the entire inside surface of the hole 14 in a printed circuit board 16. This achieves many results. First, in a double-sided or a flexible printed circuit board 16, electrical continuity from one side of the board to the other is achieved. Similarly, in a multi-layer printed circuit board 16, as shown in FIG. 5, electrical continuity among each layer 16A of the conductive patterns of the boards is achieved. Finally, the deposition of the metal 12 in the hole 14 enables the discrete components to be more rigidly anchored to a solderable surface via the leads of the components.

Figure 6:
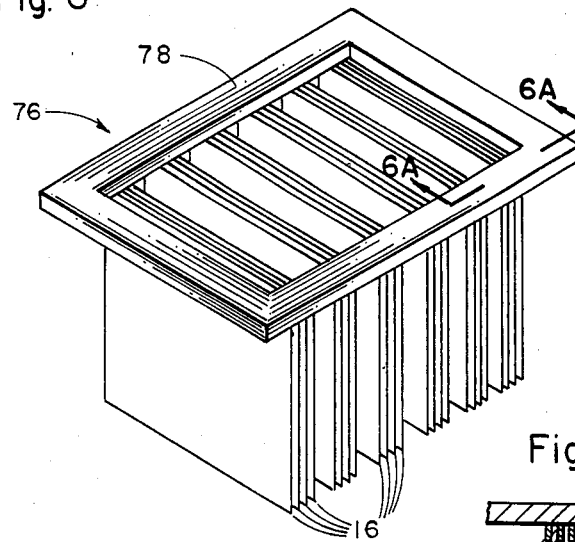
FIG. 6 is an isometric view of a printed circuit board rack having a plurality of printed circuit boards installed therein for insertion within the chamber of the plated-through-hole apparatus.
Figure 6A:
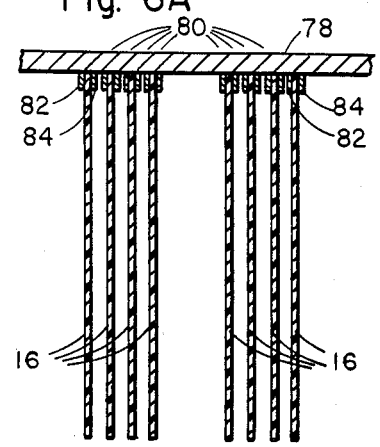
FIG. 6A is a cross-sectional view of FIG. 6 along lines 6-6A illustrating the manner in which the printed circuit boards are secured to the rack.

Several improvements have been provided to the apparatus and method previously discussed to increase the throughput of the system during production and to achieve more uniform deposition of the metal 12 within the holes 14 of the printed circuit boards 16. More particularly, the embodiment of FIG. 6 enables a plurality of printed circuit boards 16 to be quickly land easily loaded within the chamber 18 and then subsequently unloaded after treatment. The rack 76 comprises a substantially rectangular frame member 78 having a number of groups of retainer clips 80 secured to the underside thereof. Each of the retainer clips 80 comprises a left and right member 82 and 84 which are resiliently biased toward one another.

During use, the individual printed circuit boards 16 are secured to the underside of the frame member 78 by pushing the edges of the printed circuit boards 16 between the members 82 and 84 of the respective retainer clip 80. After each of the retainer clips 80 are filled with a respective printed circuit board 16, the rack 76 is lifted by hand or by a hoist, positioned over the opened end of the chamber 18, and then lowered into the chamber 18 such that the groups of the retainer clips 80 and, correspondingly, the group of installed printed circuit boards 16 are positioned between the power electrodes 66. A flange member (not shown) is connected to each of the sides of the chamber 18 to enable the frame member 78 of the rack 76 to seat thereon, rather than on top of the power electrodes 66. It is noted that the groups of retainer clips 80 must be spaced sufficiently apart such that the corresponding groups of printed circuit boards 16 will straddle, and not touch the power electrodes 66 as the groups of installed printed circuit boards 16 are loaded into their respective receiving areas 72. It is also noted that the members 82 and 84 of the retainer clips 80, the frame 78 of the rack 76, and the flange secured within the chamber 18 are each composed of an electrically conductive material such that the outer conductive layers of the printed circuit boards 16 will be electrically connected to the chamber 18 which is, in turn, connected to the ground of the generator 70. Thus, it should be appreciated that the rack 76, in addition to facilitating the loading of the printed circuit board 16 in the chamber 18, provides a convenient means for grounding the printed circuit boards 16 to the ground of the generator 70.

Figure 7:
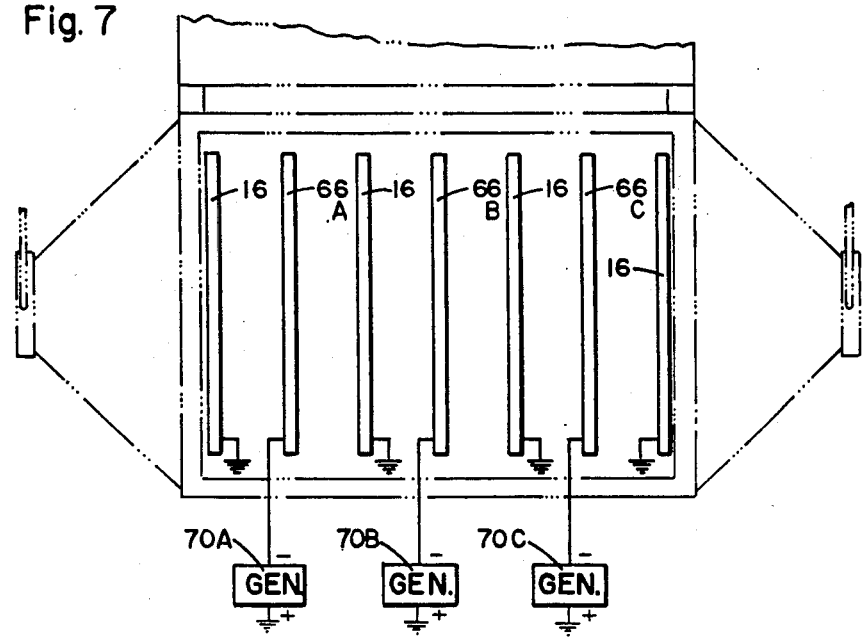
FIG. 7 is a diagrammatical view of the apparatus showing the manner in which the power electrodes may be connected to a plurality of sources of electrical energy.

Experiments have indicated that the plasma gas created within the chamber 18 will at least partially become depleted or saturated as the plasma gas flows from one end of the chamber 18 to the other. FIG. 7 is a diametric view of an improvement which compensates for any saturation of the plasma gas which may occur as the plasma gas flows from one end of the chamber 18 to the other. Specifically, this improvement includes providing three generators 70A, 70B and 70C, the output of which are respectively connected to the power electrodes 66A, 66B and 66C. Each of the generators 70A-C may individually comprise a d.c. generator, or a frequency generator, and may be individually regulated to supply the same or differing amounts of electrical energy to their respective power electrodes 66A-C. This enables an increased amount of electrical energy to be progressively supplied to the power electrodes 66A-C with respect to the direction of the flow of the plasma gas such that the plasma gas will be increasingly excited to a higher plasma state as the plasma gas flows from one end of the chamber to the other. This compensates for any saturation of the plasma gas and, therefore, assures uniform deposition of the metal 12 in the holes 14 of the printed circuit boards 16. Of course, when the direction of the flow of the plasma gas is reversed, the increased supply of electrical energy must also be reversed such that the plasma gas will always be flowing through power electrodes 66 to which a progressively increased amount of electrical energy is supplied.

It should be appreciated that the amount of sputtering of the metal 12 from the power electrodes 66 to the respective printed circuit boards 16 installed within the chamber 18 is a function of the exposed surface area ofthe power electrodes 66 and the amount of electrical energy supplied to the power electrodes 66 per unit area (for example, watts per square inch). As noted earlier, the saturation of the plasma gas as the plasma gas flows from one end of the chamber to the other is easily compensated for by increasing the amount of electrical energy supplied to succeeding power electrodes 66. Experiments have indicated, however, that the sputtering of the metal 12 from the power electrodes 66 tends to concentrate more in the holes 14 located in the outer periphery of the printed circuit boards 16 than in those holes 14 located near the center portion of the printed circuit boards 16. An improved power electrode, identified in the drawings by the numeral 86, compensates for this nonuniform sputtering of the metal therefrom by increasing the amount of exposed surface area or the power density from the center portion to the outer peripheral edges of the power electrode 86.

Figure 8:
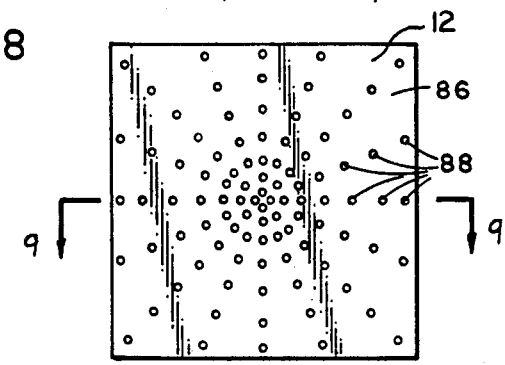
FIG. 8 is a side view of the first embodiment of an improved power electrode.
Figure 9:
FIG. 9 is a cross-sectional view of FIG. 8 along lines 8—8.

The first embodiment of the improved electrode 86 as shown in FIGS. 8 and 9 comprises incorporating a nonuniform distribution of the apertures 88 in the improved power electrode 86 such that the porosity of the improved power electrode 86 decreases from the central to the outer peripheral edges thereof. This results in a decreasing rate of exposed surface area from the central to the outer peripheral edges of the improved electrode 86. Thus, as the plasma gas flows through the apertures 88 in the improved power electrode 86, that portion of the plasma gas which flows through the apertures 88 in the center portion of the improved electrode 86 will be exposed to a greater surface area than the other portion of the plasma gas which flows through apertures 88 located in the outer portions of the improved power electrode 86. Although not shown, it is proposed that the same result may be accomplished by progressively decreasing or increasing the diameter of the apertures 88 from the center to the outer portions of the improved power electrodes 86. It can be shown mathematically that the greatest exposed surface area occurs when the diameter of the apertures 88 decreases or increase from being equal to the thickness of the electrode 86. Thus, the diameter-equal-to-thickness apertures 88 in the center portion of the improved power electrode 86 will provide an increased surface area over the other smaller (or larger) diameter apertures 88 located in the outer peripheral edges of the improved power electrode 86.

Figure 10:
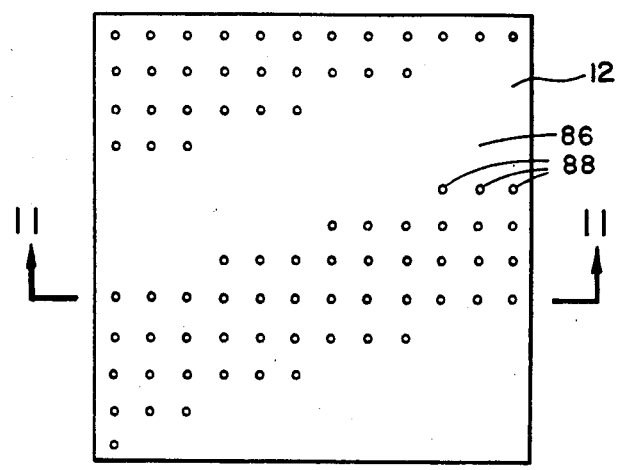
FIG. 10 is a side view of the second embodiment of the improved power electrode.
Figure 11:
FIG. 11 is a cross-sectional view of FIG. 10 along lines 11—11.

FIGS. 10 and 11 illustrate another embodiment of the improved power electrode 86 which compensates for the non-uniform sputtering of the metal 12 from the improved power electrode 86 into the holes 14 in the printed circuit boards 16. This second embodiment of the improved power electrode 86 is manufactured from a sheet of the metal 12, the opposing sides of which are convexed outwardly such that the cross-sectional configuration of the improved power electrode 86 progressively decreases from the enter to the outer portion thereof. Thus, the length of the apertures 88 in the improved power electrode 86 and the exposed surface area thereof, will progressively decrease from the center to the outer portions of the power electrode 86. It is proposed that this will achieve the same results as th first embodiment of the improved power electrode 86 such that that portion of the plasma gas flowing through the center portion of the improved power electrode 86 will be exposed to a greater surface area than the other portion of the plasma gas which flows through the outer portions of the improved power electrodes 86. Uniform sputtering of the metal 12 from the improved power electrode 86 into the holes 14 of the printed circuit board 16 will therefore be achieved.

Figure 12:
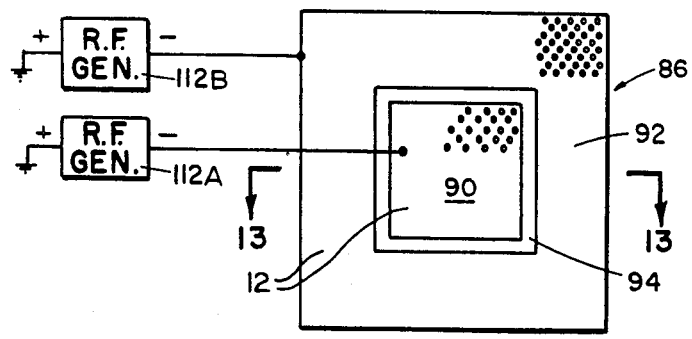
FIG. 12 is a side view of the third embodiment of the improved power electrode.
Figure 13:
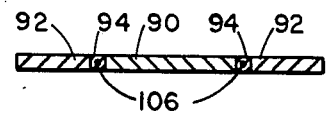
FIG. 13 is a cross-sectional view of FIG. 12 along lines 13—13.
Figure 14:
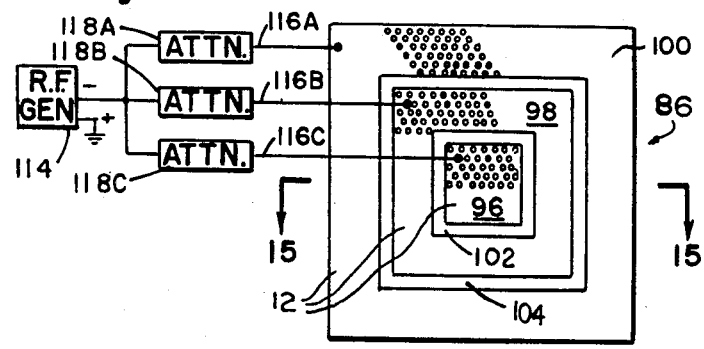
FIG. 14 is a side view of the fourth embodiment of the improved power electrode.
Figure 15:
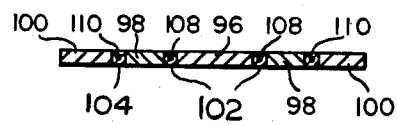
FIG. 15 is a cross-sectional view of FIG. 14 along lines 15—15.

FIGS. 12 and 13 are a side view and a cross-sectional view, respectively, of the third embodiment of the improved power electrode 86. Specifically, the third embodiment of the improved power electrode 86 comprises a central electrode 90 which is positioned within a drilled out center portion of an outer electrode 92. A suitable dielectric 94 such as a ceramic insulator is positioned within the air space between the central and the outer electrodes 90 and 92 to prevent arcing thereacross. FIGS. 14 and 15 are a side view and a cross-sectional view, respectively, of the fourth embodiment of the improved power electrode 86 which is a modification of the third embodiment shown in FIGS. 12 and 13. More particularly, the fourth embodiment of the improved power electrode 86 comprises a central electrode 96 positioned within the center of a middle electrode 98, which is in turn positioned within the center of an outer electrode 100. Two dielectrics 102 and 104 such as ceramic insulators are respectively positioned between the central electrode 96 and the middle electrode 98, and the middle electrode 98 and the outer electrode 100 to prevent arcing therebetween. A grounding wire represented by numerals 106, 108 and 110 may be molded within each of the respective dielectrics 94, 102 and 104 and connected to th ground of the system to ground any arcing which may occur between the respective electrodes 90 and 92, and 96, 98 and 100.

As shown in FIG. 12, electrical energy is supplied individually to the central and the outer electrodes 90 and 92, respectively, by means of two corresponding generators 112A and 112B. The power level of each of the generators 112A and 112B is individually controlled such that a greater amount of electrical energy is supplied to the central electrode 90 than to the outer electrode 92. This assures that the plasma gas flowing through the apertures in the central electrode 90 will be excited to a higher plasma state than the other portion of the gas flowing through the apertures in the outer electrodes 92. Uniform sputtering of the metal 12 from the electrodes 90 and 92 into the holes 14 of the printed circuit boards 16 will therefore be achieved. The use of the two generators 112A and 112B also provides for supplying electrical energy at separate or the same frequency to the central and outer electrodes 90 and 92.

In a similar manner, differing power levels of electrical energy are supplied to the electrodes 98, 100 and 102 of the fourth embodiment of the improved power electrode 86. Specifically, FIG. 14 illustrates the output of a single generator 114 being connected to each of the electrodes 98, 100 and 102 of the improved power electrode 86 by conductors 116A, 116B and 116C. Attenuators 118A, 118B and 118C are respectively interconnected within the conductors 116A, 116B and 116C to individually attenuate the power level of the electrical energy being supplied from the generator 114 to the electrodes 96, 98 and 100. Thus, a greater power density of the electrical energy may be achieved on the central electrode 96 than on the middle electrode 98, and as the middle electrode 98 than the outer electrode 100. It is noted that, unlike the generators 112A and 112B described in conjunction with the third embodiment of the improved power eleotrode 86, the use of a single generator 114, together with the attenuators 118A–C in the fourth embodiment for the improved power electrode 86, precludes the supply of electrical energy at different frequencies to the individual electrodes 96, 98 and 100. It shall be understood, however, that individual generators may be electrically connected to the electrodes 96, 98 and 100 such that not only different power levels may be supplied to the individual electrodes 96, 98 and 100, but also electrical energy at different frequencies may be supplied to the individual electrodes 96, 98 and 100.

Figure 16:
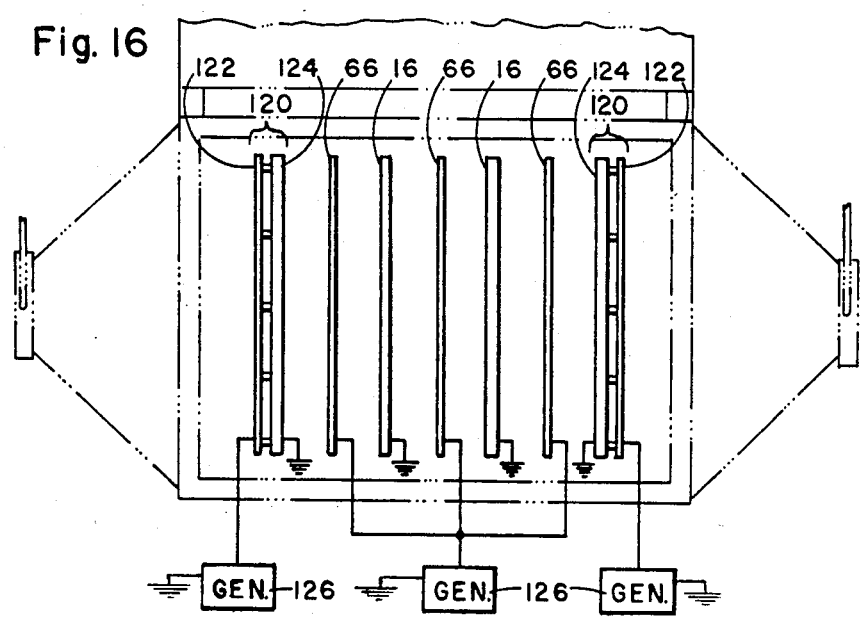
FIG. 16 is a diagrammatical view of the apparatus of the present invention incorporated within the plasma desmearing apparatus of my prior invention.

FIG. 16 is a diagrammetric view of the apparatus 10 of the invention incorporated within the desmearing apparatus which is more particularly disclosed in my U.S. Pat. Nos. 4,328,081 and 4,425,210, entitled "Plasma Desmearing Apparatus and Method", the disclosures of which are hereby incorporated by reference into this application. Briefly summarizing, those prior inventions comprised a plurality of electrode pairs 120 which were uniformly spaced within a chamber or the like. Each electrode pair comprised a power electrode 122 spaced an appreciable distance apart from a ground electrode 124. The output of a generator 126 was then connected to the power electrode 122, with the ground electrode 124 being connected to the ground of the generator 126. Two such electrode pairs 120 are positioned within the chamber 18 of my present invention (compare FIGS. 3 and 16). Then, three of the power electrodes 66 of the present invention are equally spaced within the distance between the electrode pairs 120. Two printed circuit boards 16 are then inserted between the power electrodes 66 in the respective receiving areas 72. The first step of the treatment of the printed circuit boards 16 involves desmearing the holes 14 contained therein according to my prior inventions. Then, the holes 14 in the printed circuit boards 16 are plated-through by using the method of the present invention. It is noted that means must be provided for only grounding the printed circuit boards 16 during the plated-through-hole method and not during the desmearing process. The combination of the present invention and those prior inventions enables a single chamber to accomplish the desmearing method and the plated-through-hole method discussed above.

Experience has indicated that the printed circuit boards 16 become excessively heated during the deposition process described above. The improved plated-through-hole apparatus and method overcomes this problem by four different means which present excessive heat build-up within the chamber 18.

Figure 17:
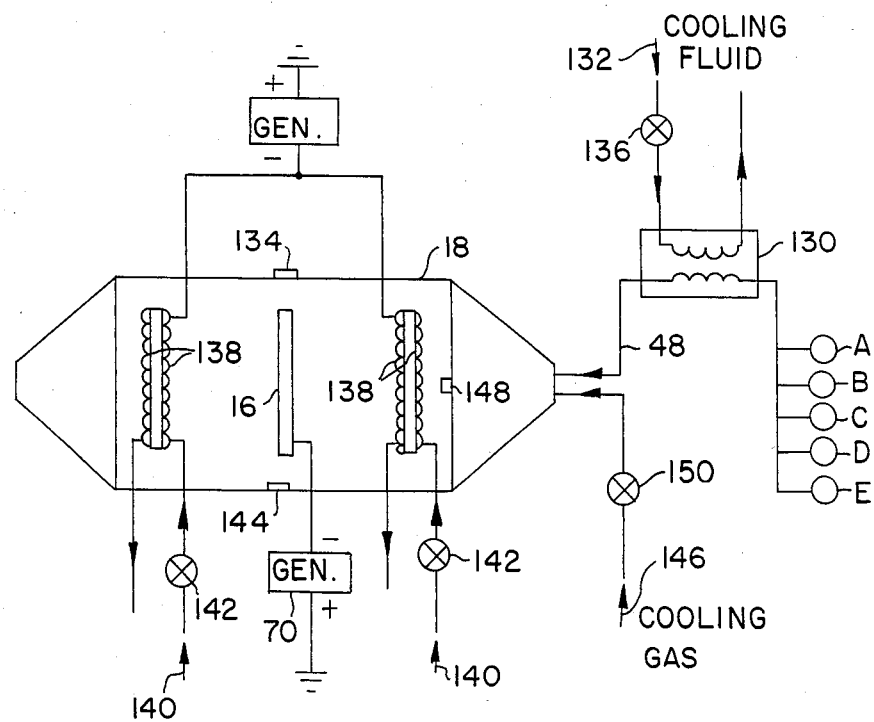
FIG. 17 is a diagrammatical view of the improved apparatus of the present invention designed to prevent excessive heat build-up within the chamber during the deposition process.

As shown in FIG. 17, the first heat preventative means comprises a heat exchanger 130 which is connected in fluid communication with conduit 48 which connects the gas supplies A-E to the chamber 18 and in fluid communication with a source of cooling fluid, represented by the numeral 132.

During operation, the gases A-E which is supplied to the chamber 18 is first precooled by means of the cooling fluid 132 circulating in heat exchange relationship therewith in the heat exchanger 130. The amount of cooling of the gases A-E may be regulated in accordance with the actual temperature of chamber 18 by means of a temperature sensor 134 in thermal contact with the chamber 18 for controlling a flow rate valve 136. Hence, the actual temperature of the chamber 18, and thus the printed circuit boards 16, may always be regulated to prevent excessive heating thereof.

The second heat preventative means comprises a heat exchanger 138 incorporated into each power electrode 66. A cooling fluid, such as nitrogen, represented by numeral 140, is circulated through the heat exchanger 138 of the power electrodes 66 to cool the gases A-E which are flowing within the chamber 18. As before, the flow of the cooling fluid 140 may be regulated by valves 142 controlled by temperature sensors 144.

The third heat preventative means comprises introducing a cooling gas 146 into the chamber 18 before the deposition process begins and during the deposition process when the electrical energy supplied by generator 70 is turned "off". The cyclic rates of introducing the cooling gas 146 into the chamber 18 may be preset at regular intervals of the deposit in process, or whenever the temperature of the chamber 18 exceeds a preset temperature limit as sensed by temperature sensor 148 which controls valve 150.

The fourth heat preventative means comprises a pair of electromagnetic coils and a generator to supply electrical energy to the coils. The coils are placed on the chamber in such a way that, when energized, they produce a strong magnetic field which is parallel to the electrodes within the vacuum chamber. Experience has shown that the principal cause of excessive heating in the objects being plated is bombardment by energetic electrons from the plasma. The fourth heat preventative means operates by using a strong magnetic field to direct the energetic electrons away from the object being plated.

Plasma Desmearing and Plated-Through-Hole Apparatus and Method

Figure 18:
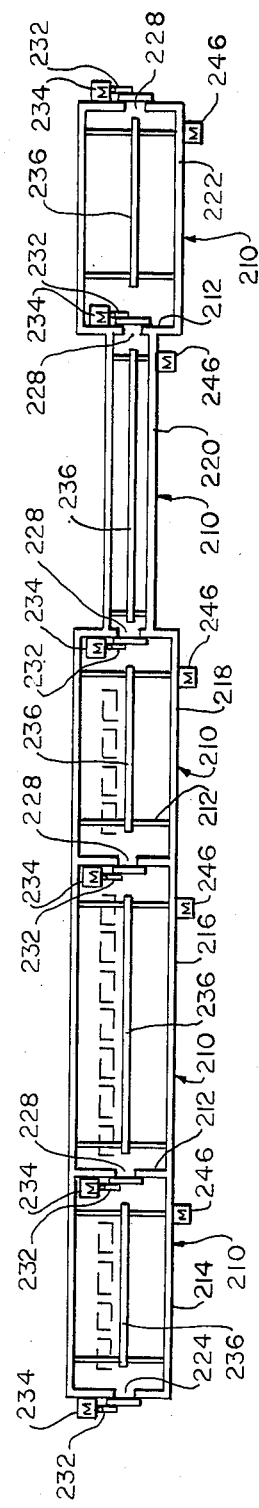
FIG. 18 is a diagrammatical view of the plasma desmearing and plated-through-hole apparatus comprising a series of interconnected vacuum chambers in which the multi-layer printed circuit boards are first desmeared and then plated through as the boards sequentially are transported through the chambers.
Figure 19:
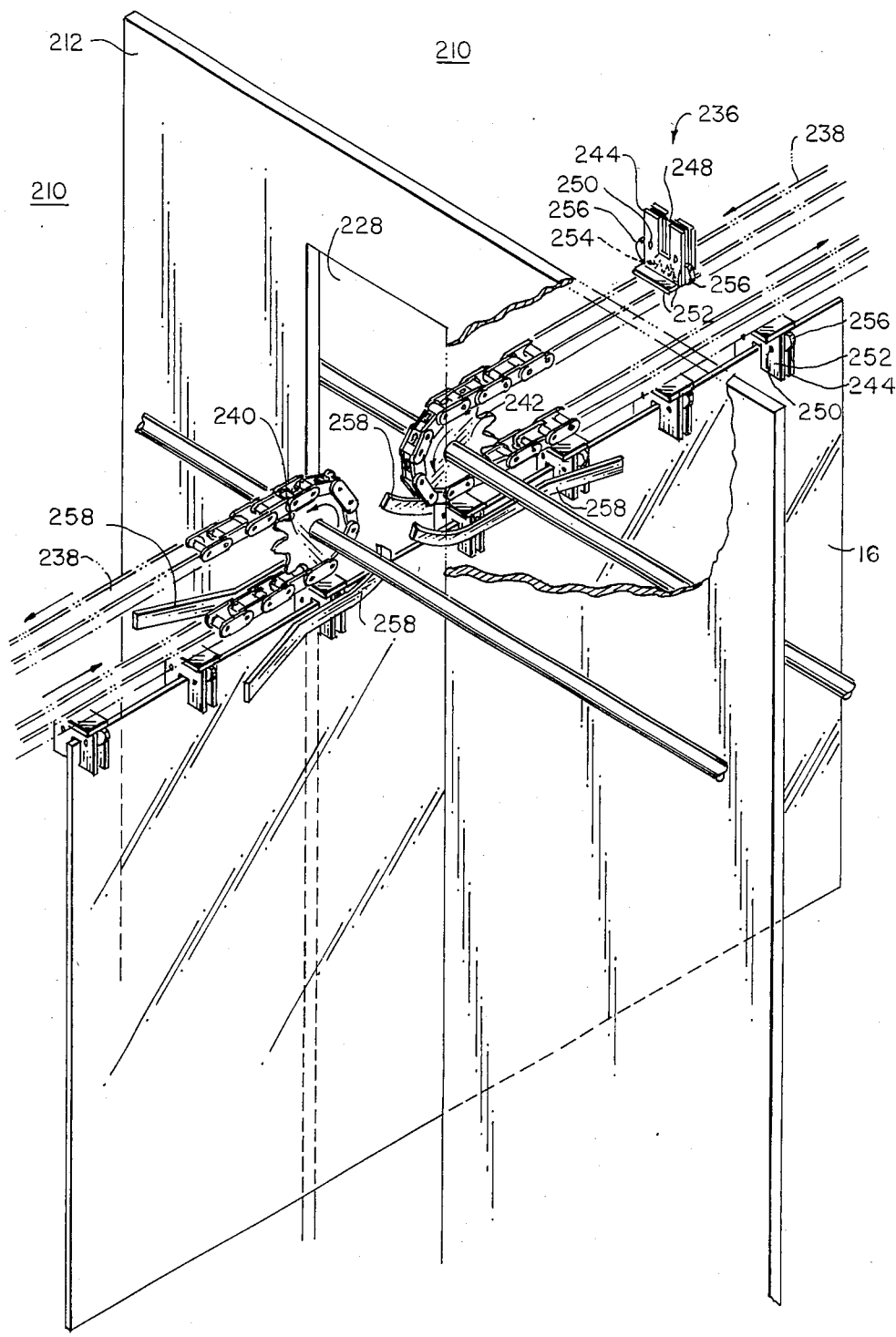
FIG. 19 is a perspective view of the transport system of the invention which sequentially transports the printed circuit boards through each succeeding vacuum chamber.

Referring now to FIGS. 18 and 19, the invention further comprises an integrated plasma desmearing and plated-through-hole apparatus 200 designed to first plasma desmear a printed circuit board 16 and then plate through the holes of the printed circuit board 16 either through the use of conventional sputtering techniques or the novel plasma sputtering method as dscribed hereinabove.

More particularly, the apparatus 200 of the invention comprises a plurality of vacuum chambers generally indicated by numeral 210 interconnected together in a series and having common walls 212 which isolate adjacent chambers. Preferably, five vacuum chambers 210 are provided comprising a loading chamber 214, a desmearing/etch-back chamber 216, a plating preparation chamber 218, a plating chamber 220 and an unloading chamber 222. An opening 224 is provided in the left wall of the loading chamber 214 allowing the boards 16 to be loaded therein. Similarly, an opening 226 is provided in a wall of the unloading chamber 222 to allow the treated boards 16 to be unloaded therefrom. Each of the common walls 212 separating adjacent chambers 210 also includes an pening 228 allowing the boards 16 to sequentially move through the series of chambers 210. Each of the openings 224–228 are provided with airtight isolation doors 230 mounted on respective hinge pins 232. Each of the isolation doors 230 are operated by means of a motor 234 operatively connected to the hinge pin 232 thereof.

Referring specifically to FIG. 19, a transport system, generally indicated by numeral 236, is positioned within each of the chambers 210 for transporting a printed circuit board 16 through the chamber and then passing the board 16 (through opening 228) to the transport system 236 positioned in the adjacent chamber. This process of moving the boards 16 through the preceding chamber and then passing the board 16 through the opening 228 to the transport system 236 positioned in the succeeding chamber, allows the respective isolation doors 230 to close, thereby sealing-off the adjacent chambers from one another.

The preferred embodiment of the transport system 236 comprises a chain 238 entrained about a drive sprocket 240 and an idler sprocket 242, both suspended from the roofs of the chambers. The sprockets 240 and 242 and correspondingly chain 238, extend along the longitudinal length of the respective chambers 210 from the input to the output thereof. However, the sprockets 240 and 242 are not positioned sufficiently close to the isolation doors 230 to interfere with the operation of the doors 230.

Affixed to the chain 238 are a plurality of spring-loaded clips 244 which resiliently grasp the printed circuit boards 16 as the boards 16 pass through the chambers 210. The spring-loaded clips 244 are further designed to release the printed circuit board 16 as the clips 244 begin to revolve about the sprockets 240 and 242 so that the boards 16 can be passed through the openings 228 to the transport system 236 positioned in the adjacent chamber 210. It is noted that the sprockets 240 and 242 of each transport system 236 are aligned within the respective chambers 210 throughout the entire length of the apparatus 200 to assure that the printed circuit boards 16 move straight through the apparatus 200 without bending. It is also noted that each drive sprocket 240 is operatively connected to a motor 246 so that operation of each transport system 236 is independently synchronized with the others.

While many embodiments of the clips 244 are possible, one such embodiment of the clips 244 comprises a pair of opposing arms 248 which are pivoted about point 250 on bracket 252 affixed to the chain 238. An internal spring 254 resiliently biases the arms 248 about the pivot points 250 to cause gripping of the board 16. In order to provide for releasing a board, the arms 248 include outwardly protruding ears 256 which, when squeezed, overcome the force of springs 254 thereby releasing the board 16 from between the arms 248. The squeezing operation is accomlished by positioning a pair of rails 258 about the periphery of the sprockets 240 and 242 in alignment with the ears 256 such that the ears 256 are squeezed as they pass therebetween.

Referring again to FIG. 18, the method of the invention comprises, first, demmearing the holes of the printed circuit board 16, and then plating through such holes, each step of which is accomplished in an air-free, uncontaminated environment in the vacuum chambers 210. More specifically, the desmearing portion of the method is accomplished by, first, introducing the smeared and unplated printed circuit board 16 into the transport system 236 of the loading chamber 214. After closing its isolation doors 230, the air contained therein is evacuated. Plasma is then created within the loading chambers 214 to increase the temperature of the printed circuit board 16. Hence, the loading chamber 214 functions not only as a loading chamber but also as a warming chamber. Simultaneously, the adjacent desmearing chambers 216 is evacuated in preparation for receiving the warmed printed circuit boards 16.

After the printed circuit board 16 has been warmed to a predetermined temperature and the desmearing chamber 216 has also been evacuated, the isolation door 230 therebetween is opened. The transport systems 236 positioned in the loading chamber 214 and the desmearing chamber 216 are actuated to transport the warmed printed circuit boards 16 into the desmearing chamber 216. When properly positioned therein, isolation door 230 therebetween is closed to allow another smeared, unplated printed circuit board 16 to be introduced into the loading chamber 214.

The components in the desmearing chamber 216 are then actuated along with the introduction of appropriate gases to desmear the holes of the printed circuit boards 16. Although not specified in detail, it is noted that such desmearing components may comprise those desmearing components disclosed in the desmearing patents referenced above and incorporated by reference herein. During the desmearing of the board 16, the next adjacent chamber; namely, the plating preparation chamber 218, is evacuated. Once evacuated, the isolation door 230 between the chambers 216 and 218 is opened and the respective transport systems 236 are actuated to transport the desmeared printed circuit boards 16 into the plating preparation chamber 218. In the plating preparation chamber 218, additional active gases may be injected therein to more fully clean the printed circuit board 16 prior to plating. Also, the board 16 may be kept warm by creating plasma gas in the chamber.

It is noted that the type of electrodes used in the loading, desmearing and plating preparation chambers 214–218 may comprise the novel paired electrodes disclosed in the pending patent application, Ser. No. 06/641,164, filed Aug. 15, 1984, and entitled "Paired Electrodes for Plasma Chambers", the disclosure of which is hereby incorporated by reference herein. However, it shall also be understood that the type of electrodes used in such chambers may comprise those disclosed in the plasma desmearing patents referenced above.

The method of the invention continues by evacuating the plating chamber 220 and, after evacuation, transporting (in the same manner as discussed above) the printed circuit boards 16 therein. Contained within the plating chamber 220 are various components designed to plate a metal, such as copper, into the holes (and all exposed surfaces) of the printed circuit board 16. These plating components may comprise those discussed above in regard to plasma plating-through-hole. Alternatively, those plating components may comprise a conventional cathode sputtering assembly such as that produced by Enerjet, a division of Kurt J. Lesker Co. and sold under the trademark "Torus". More particularly, those conventional cathode sputtering components may include Torus Model 25EL linear sputtering source (Part No. TRS-025EL) as more particularly disclosed in the Information Disclosure Statement filed concurrently herewith, the disclosure of which is incorporated by reference herein.

Finally, after plating through the printed circuit board 16 to fully deposit a conductive material on the inside surfaces of the holes contained therein, the desmeared and plated board 16 is transported from the plating chamber 220 into the last chamber; namely, the unloading chamber 222, having been previously evacuated. After closure of the isolation door 230 between the plating chamber 220 and the unloading chamber 222, the unloading chamber 222 is vented to the atmosphere. When the pressure of the unloading chamber 222 reaches atmospheric pressure, the unloading chamber's 222 exterior isolation door 230 is opened and the printed circuit board 16 is transported therefrom.

From the foregoing, it should be appreciated that the printed circuit board 16 originally introduced into the loading chamber 214 is sequentially treated in each of the succeeding chambers 210 of the apparatus 200. It is also noted that additional printed circuit boards 16 may oontinually be sequentially introduced into the loading chambers 214 each step of the process. Hence, the printed circuit boards 16 are sequentially desmeared and plated on a production line basis.

The present disclosure includes that contained in the appended claims as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

Now that the invention has been described,
What is claimed is:

1. An apparatus for desmearing holes in a printed circuit board and then plating a conductive material on the inside surfaces of such holes, comprising in combination:
- a loading vacuum chamber;
- a desmearing vacuum chamber;
- a plating preparation vacuum chamber;
- a plating vacuum chamber;
- an unloading vacuum chamber;
- means for interconnecting said chambers with one another in the specified order;
- transport means positioned within each said chamber for transporting the printed circuit board through said chamber;
- said desmearing vacuum chamber comprising means for desmearing the holes of the printed circuit board positioned therein;
- said plating vacuum chamber comprising means for plating the material on the inside surfaces of the holes contained in the printed circuit board;
- said interconnecting means comprising affixing adjacent said chambers together in said series to define a common wall therebetween, said common wall including an opening allowing the printed circuit board to be transported from a preceding said chamber into a succeeding, adjacent said chamber, said common wall further including an isolation door movable about said opening for selectively isolating said preceding said chamber from said succeeding, adjacent said chamber, and
- said transport means comprising a plurality of clips and means for moving said clips along the longitudinal lenght of said chamber, said clips comprising means for engaging the printed circuit board upon entry into said chamber and then disengaging said clips from the printed circuit board as the printed circuit board exits said chamber such that the printed circuit board is engaged by successive said clips as the printed circuit board enters said chamber, is retained by said clips for transport along the longitudinal length of said chamber, and released by successive clips as the printed circuit board exits said chamber and is passed into the succeeding said chamber.

2. The apparatus as set forth in claim 1, wherein said moving means comprises a flexible member entrained about a pair of pulley means positioned at opposing longitudinal ends of said chamber and means for affixing said clips to said flexible member such that said clips are transported by said flexible member along the longitudinal length of said chamber.

3. The apparatus as set forth in claim 2, wherein said engaging means comprises a pair of arms and means for resiliently urging said arms together to engage the printed circuit board therebetween.

4. The apparatus as set forth in claim 1, wherein said loading vacuum chamber and said unloading vacuum chamber each comprises an opening and an isolation door affixed about said opening, allowing the printed circuit board to be loaded into said loading vacuum chamber and unloaded from said unloading vacuum chamber.

5. The apparatus as set forth claim 2, wherein said interconnecting means interconnects said chambers in a straight line such that the printed circuit board moves straight through the interconnected said chambers.

6. An apparatus for desmearing holes in a printed circuit board and then plating a conductive material on the inside surfaces of such holes, comprising in combination:
- a loading vacuum chamber;
- a desmearing vacuum chamber;
- a plating vacuum chamber;
- means for interconnecting said chambers with one another in the specified order;
- transport means positioned within each said chamber for transporting a printed circuit board through said chamber;
- said desmearing vacuum chamber comprising means for desmearing the holes of the printed circuit board positioned therein;
- said plating vacuum chamber comprising means for plating the material on the inside surfaces of the holes contained in the printed circuit board;
- said transport means comprising a plurality of clips and means for moving said clips along the longitudinal length of said chamber, said clips comprising means for engaging the printed circuit board upon entry into said chamber and then disengaging said clips from the printed circuit board as the printed circuit board exits said chamber;
- said moving means comprising a flexible member entrained about a pair of pulley means positioned at opposing longitudinal ends of said chamber and means for affixing said clips to said flexible member such that said clips are transported by said flexible member along the longitudinal length of said chamber;
- said engaging means comprising a pair of arms and means for resiliently urging said arms together to engage the printed circuit board therebetween; and
- said transport means further comprising rail means positioned at opposing longitudinal ends of said chamber to engage said arms of said clip forcing said arms apart to disengage the printed circuit board.

* * * * *